(12) United States Patent
Guo et al.

(10) Patent No.: US 7,344,990 B2
(45) Date of Patent: Mar. 18, 2008

(54) METHOD OF MANUFACTURING MICRO-STRUCTURE ELEMENT BY UTILIZING MOLDING GLASS

(75) Inventors: Huang-Chen Guo, Hsinchu (TW); Pong Lai, Hsinchu (TW); Ying-Tsung Lu, Hsinchu (TW); Wann-Diing Tyan, Hsinchu (TW); Hsiu-Hsiang Chen, Hsinchu (TW); Rung-Ywan Tsai, Hsinchu (TW); Chang-Sheng Chu, Hsinchu (TW); Jyh-Long Chern, HsinChu (TW)

(73) Assignee: Industrial Technology Research Institute, Hsinchu (TW)

( * ) Notice: Subject to any disclaimer, the term of this patent is extended or adjusted under 35 U.S.C. 154(b) by 118 days.

(21) Appl. No.: 11/082,841

(22) Filed: Mar. 18, 2005

(65) Prior Publication Data

US 2006/0110845 A1    May 25, 2006

(30) Foreign Application Priority Data

Nov. 23, 2004   (TW) ............................. 93135991 A

(51) Int. Cl.
    *H01L 21/311* (2006.01)
(52) U.S. Cl. .............................. 438/703; 257/E21.029
(58) Field of Classification Search ................ 438/747, 438/723, 703
    See application file for complete search history.

(56) References Cited

U.S. PATENT DOCUMENTS 5,772,905 A *   6/1998  Chou ........................... 216/44
    2005/0067286 A1*  3/2005  Ahn et al. ..................... 205/70

* cited by examiner

*Primary Examiner*—Scott B. Geyer
*Assistant Examiner*—Elias Ullah

(57) ABSTRACT

A method of manufacturing micro-structure elements by utilizing molding glass includes the steps of forming a mold having a micro-structure pattern thereon by using an electroforming process, making a copy of the micro-structuring pattern on a glass structure by using glass molding technology, and filling clothing material on the glass substrate to form a micro-structure element with less complex and cost, thereby being suitable for mass production.

15 Claims, 12 Drawing Sheets mold releasing

METHOD OF MANUFACTURING MICRO-STRUCTURE ELEMENT BY UTILIZING MOLDING GLASS

BACKGROUND OF THE INVENTION

1. Field of Invention

The invention relates to a method of manufacturing a micro-structure element, and particularly to a method of manufacturing micro-structure element a by utilizing molding glass.

2. Related Art

With the rapid development of semi-conductor and optical communication system technology, the requirements system integration, size reduction and improved convenience are increasing day by day. Nowadays, the method of manufacturing micro-structure elements such as optical wave guide elements has become more complex than before.

The related methods of manufacturing micro-structure elements mainly comprise three types; one is a heat embossing process, second is a step and flash imprint lithography process, and the third is a soft lithography process. These types have the disadvantages of higher cost and difficulty to change the material collectively. Refer to U.S. Pat. No. 5,772,905, which provides steps to coat a thermoplastic polymer on a substrate before performing the heat embossing process. The polymer is softened by controlling temperature and pressure conditions, and then is transformed to a nano-element by an imprinting process.

In addition, the method of manufacturing an optical wave guide element applied in various systems and instruments mainly uses photo-lithography technology. The steps comprise forming a glass fiber on the recess portion of a substrate, filling polymer material in a die having specific shapes thereon, and depositing the major material of the optical wave guide element on the substrate, which involves forming photo-resist material over the major material, forming the photo-resist material by exposure and developing processes, etching the major material by means of the photo-resist material, and removing the photo-resist material. The optical wave guide element is thus formed.

The above-described technology for manufacturing micro-structure elements has some disadvantages, including being more complicated and harder to mass produce so as to incur high costs. Hence, improving the method of manufacturing micro-structure elements is currently an important focus of the art.

SUMMARY OF THE INVENTION

The invention provides a method of manufacturing micro-structure elements by utilizing molding glass. By using glass molding technology, form the micro-structure element on a glass, which is formed by a mold having a micro-structure pattern thereon. This method of the invention is easier for mass production, saves manufacturing costs.

Accordingly, the method of manufacturing a micro-structure element by utilizing molding glass includes the steps of forming a mold with a micro-structure pattern thereon from an electroforming material by using an electroforming process, imprinting the mold directly onto a glass substrate for making a copy of the micro-structure pattern of the mold directly on the glass substrate, and filling a clothing material into the copy of the micro-structure pattern of the glass substrate.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
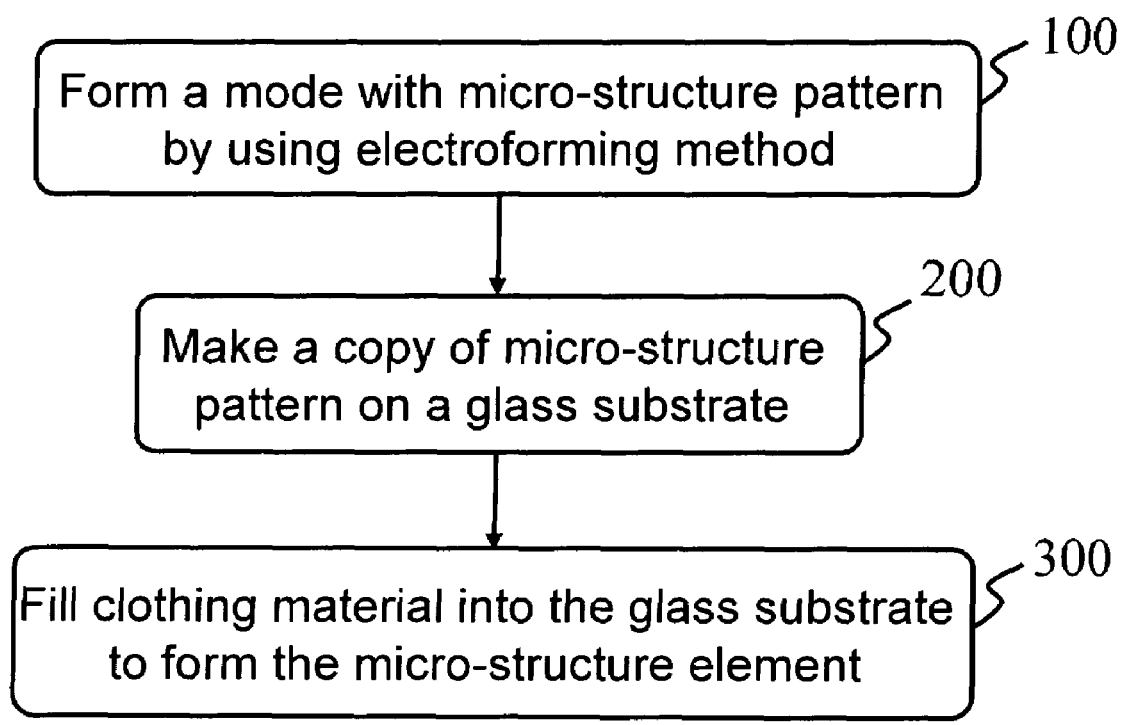
FIG. 1 is a flow chart of the manufacturing method for a micro-structure element of the invention.

Please refer to FIG. 1. The steps of the method of manufacturing micro-structure elements by utilizing molding glass of the invention are disclosed as follows. First, form a mold, which has a micro-structure pattern thereon, by using an electroforming method according to step 100. Make a copy of the micro-structure pattern on a glass substrate by utilizing the mold according to step 200. Finally, fill clothing material into the glass substrate. The micro-structure element is formed according to step 300.

According to the above-mentioned description, the method of manufacturing micro-structure elements by utilizing molding glass of the invention can be applied to various micro-structure elements having different materials. The details description is illustrated as follows.

FIGS. 2A to 2D are schematic views, which show steps of the method of manufacturing micro-structure elements by utilizing molding glass as disclosed in the first embodiment of the invention.

Figure 2A:
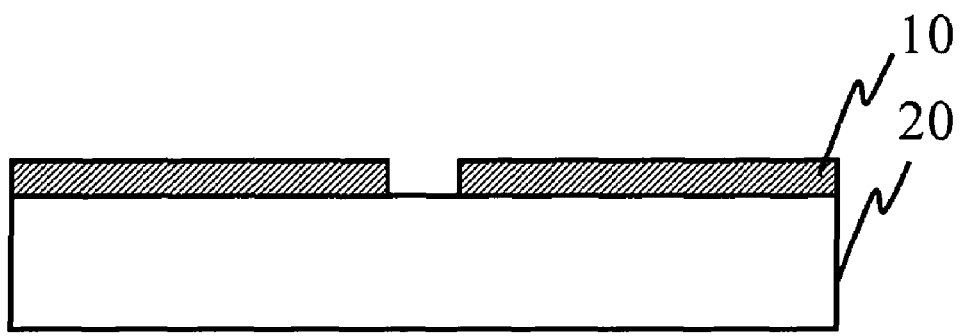
FIGS. 2A to 2D are schematic views, which show steps of the method of manufacturing a micro-structure element by utilizing molding glass as disclosed in the first embodiment of the invention.

Please refer to FIG. 2A. By using photo-lithography technology, the photo-resist material is formed on a substrate 20. After exposure and developing processes, the photo-resist material is transformed to a photo-resist layer 10 by a mask (not shown). The photo-resist layer has a micro-structure pattern thereon.

Figure 2B:
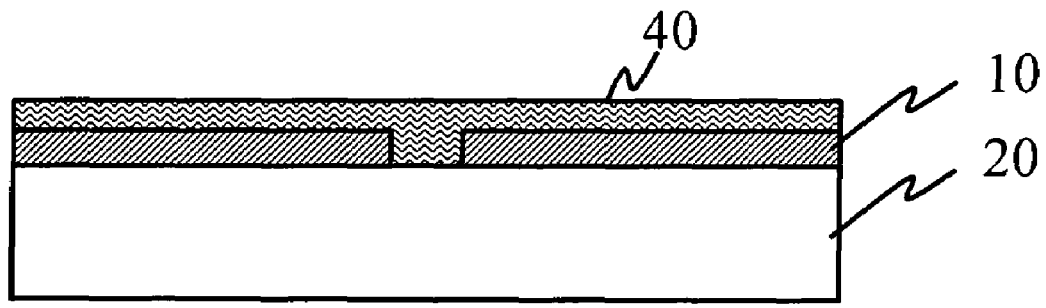

Please refer to FIG. 2B. By using electroforming technology, the electroforming material is formed on the substrate 20. Hence, the micro-structure pattern on the photo-resist layer 10 is copied onto the electroforming material, which is transformed to a mold 40 according to step 100 in FIG. 1. The micro-structure pattern on the mold 40 is preferred to create a prominence.

Figure 2C:
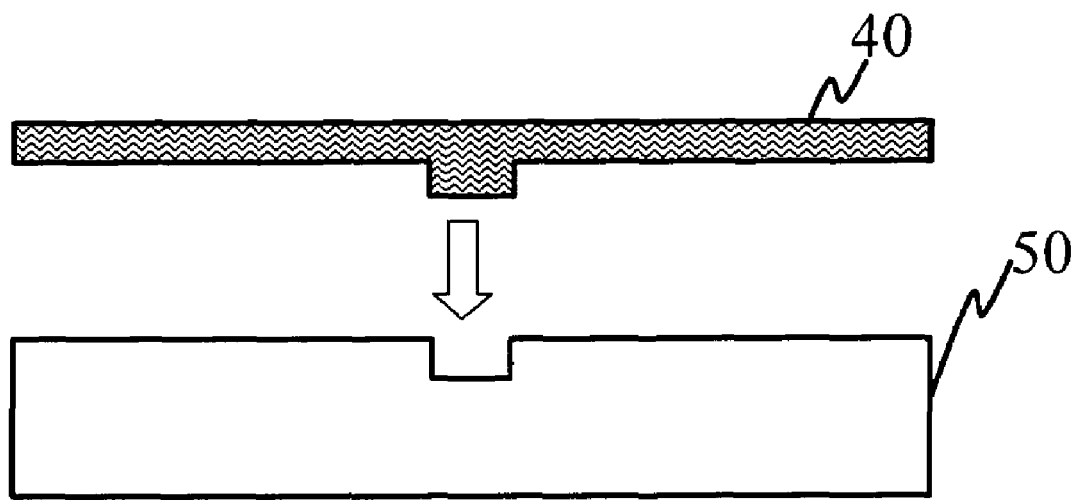

Please refer to FIG. 2C. By using a glass molding machine (not shown), the mold 40 is imprinted directly on a glass structure 50. The micro-structure pattern is thus copied directly onto the glass substrate 50.

Please refer to FIG. 2C. By using a glass molding machine (not shown), the mold 40 is imprinted on a glass structure 50. The micro-structure pattern is thus copied onto the glass substrate 50.

Figure 2D:
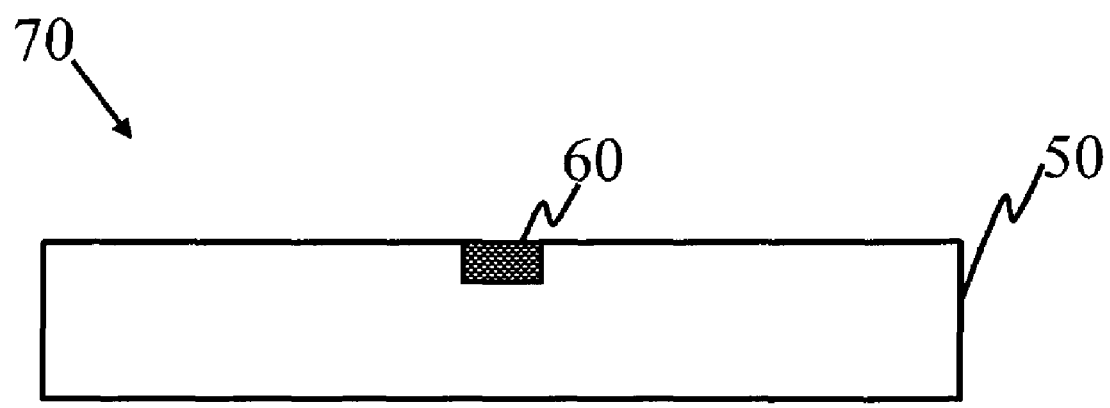
Figure 3A:
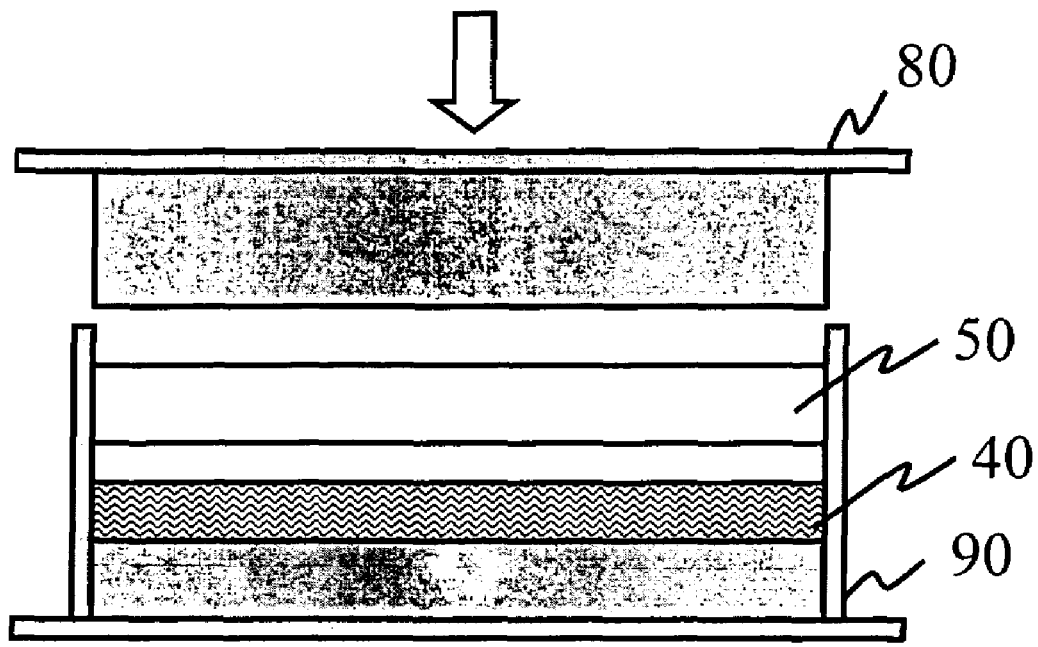
FIGS. 3A to 3F are schematic views, which show the steps of manufacturing molding glass as disclosed in the first embodiment of the invention.
Figure 3B:
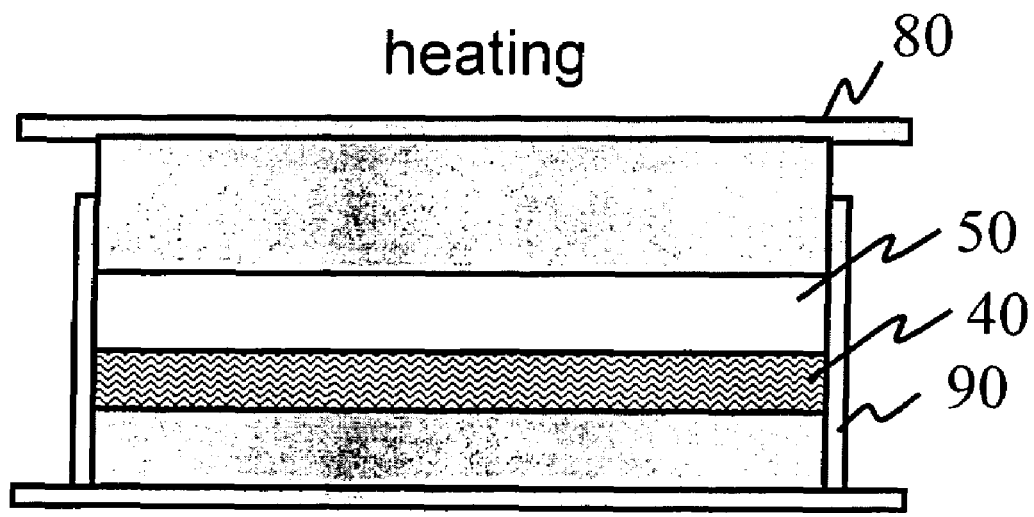
Figure 3C:
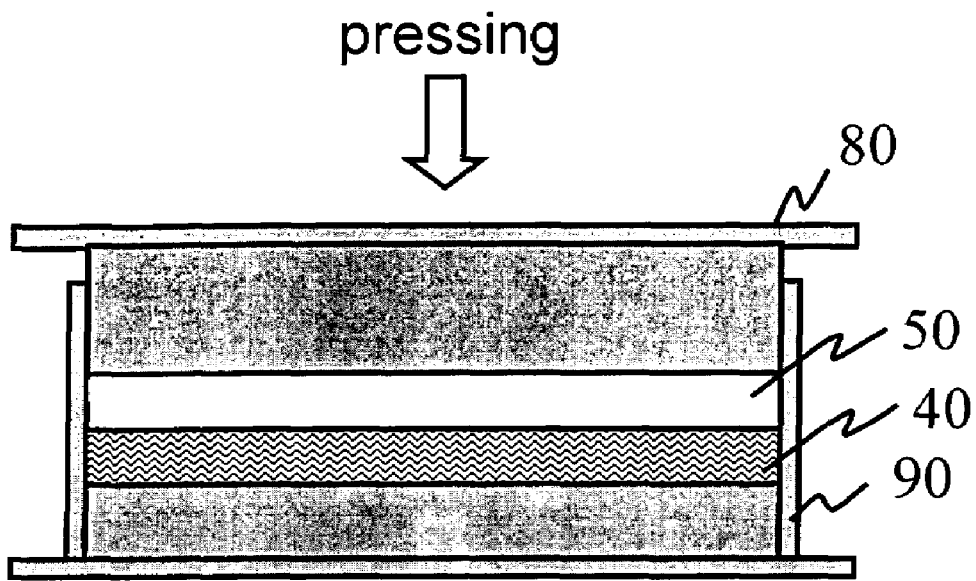
Figure 3D:
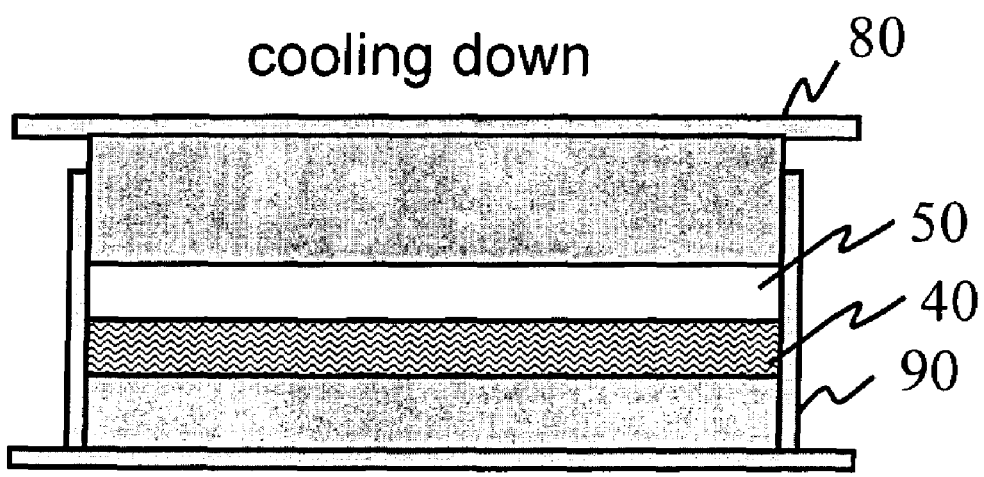
Figure 3E:
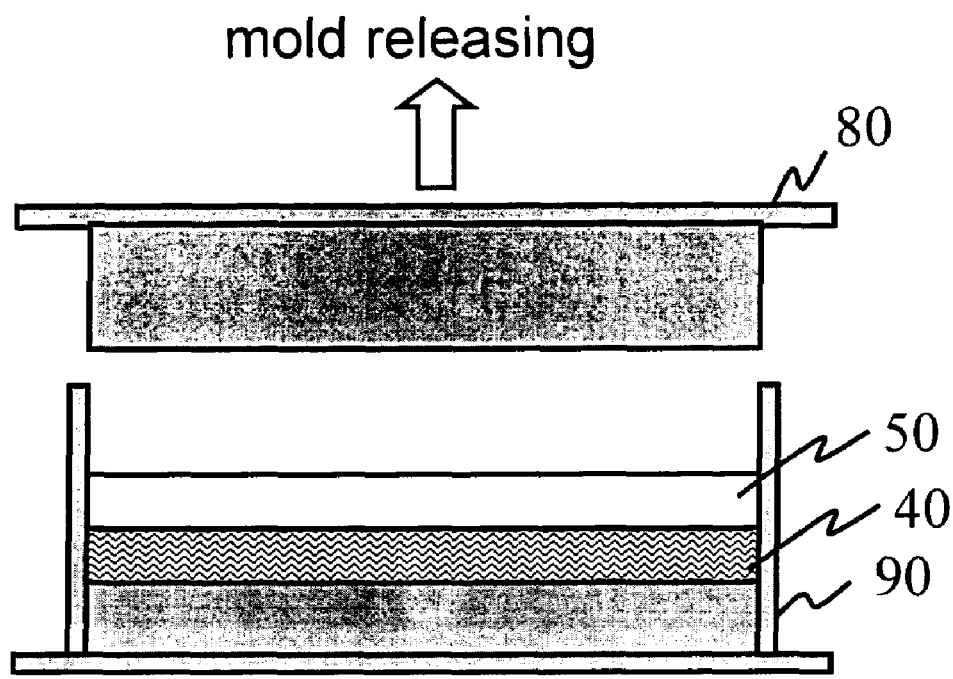
Figure 3F:
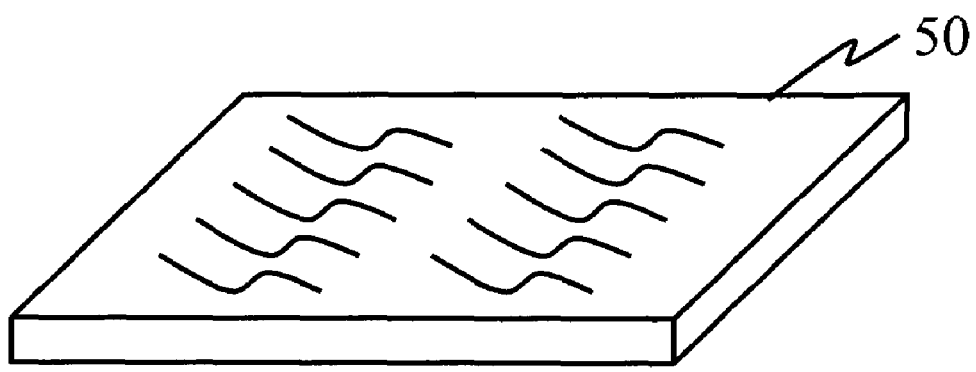

Finally, please refer to FIG. 2D. The clothing material 60 is coated on the glass substrate 50. That is, the clothing material 60 is filled in the micro-structure pattern of glass substrate 50, wherein the micro-structure pattern is preferred to create a recess. The micro-structure element 70 is thus made according to step 300 in FIG. 1.

Please refer to FIGS. 3A to 3F, which are schematic views showing the steps of manufacturing molding glass as disclosed in the embodiment of the invention described above. The steps include putting the mold 40, the glass substrate 50, and an upper die 80 into a die ring 90 according to FIG. 3A. Also, the temperature of the whole die set, which comprises the upper die 80 and the die ring 90, is raised according to FIG. 3B. This means that the mold 40 and the glass substrate 50 are heated at the same time. When the temperature of the die set approaches a specific degree, heat stress is brought on the upper die 80 according to FIG. 3C. The die set is then cooled down according to FIG. 3D. Finally, the upper die 80 is released from the die ring 90 when the temperature of the die set is cooled down to atmospheric temperature according to FIG. 3E. The glass substrate 50 having the micro-structure pattern is completed according to FIG. 3F.

FIGS. 4A to 4D are schematic views that show steps of the method of manufacturing micro-structure elements by utilizing molding glass as disclosed in the second embodiment of the invention.

This embodiment is a method of manufacturing a substrate with a micro-structure pattern thereon by utilizing an etching process. First, photo-resist material is formed on a substrate 21. After exposure and developing processes, the photo-resist material is transformed to a photo-resist layer 11 by a mask (not shown) according to FIG. 4A. Perform an etching process on the photo-resist layer 11 by etching solvent according to FIG. 4B. After removing the photo-resist layer 11, the substrate 21 having a micro-structure pattern, which includes several recesses, is formed according to FIG. 4C.

Figure 4A:
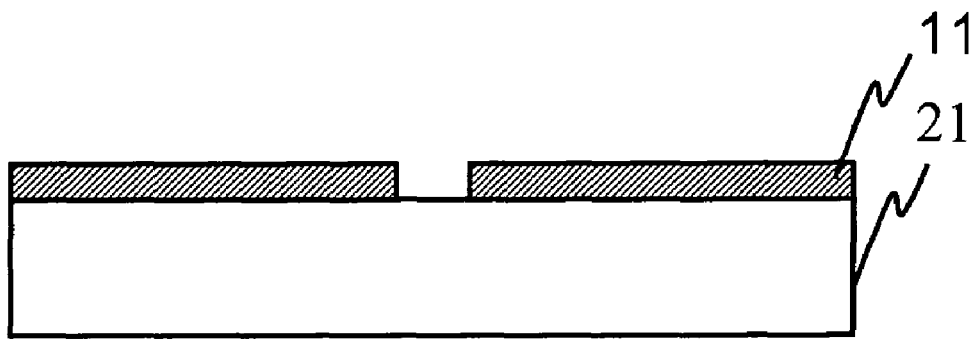
FIGS. 4A to 4F are schematic views, which show steps of the method of manufacturing a micro-structure element by utilizing molding glass as disclosed in the second embodiment of the invention.
Figure 4B:
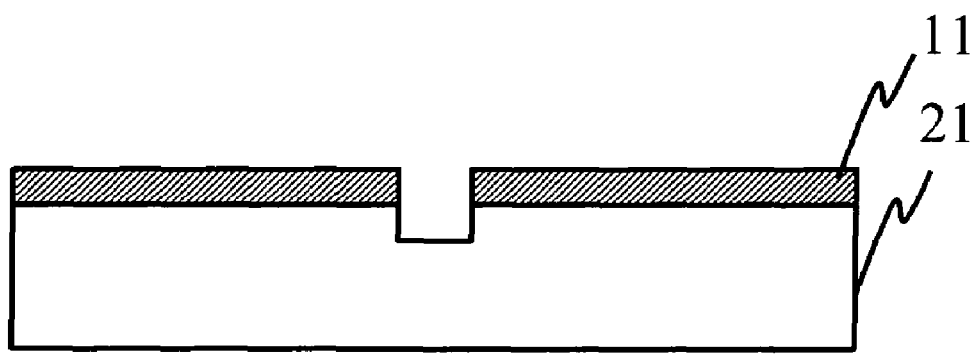
Figure 4C:
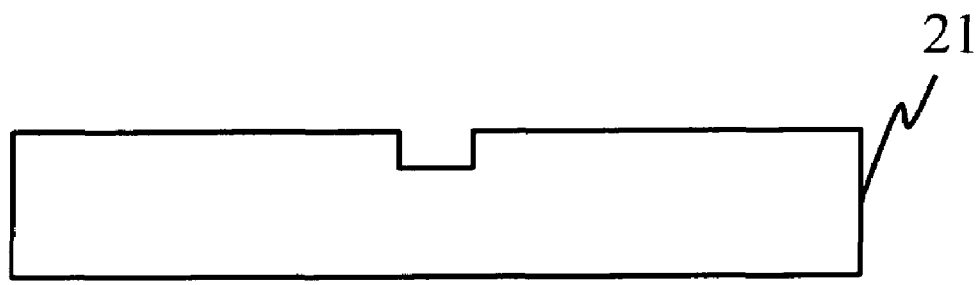
Figure 4D:
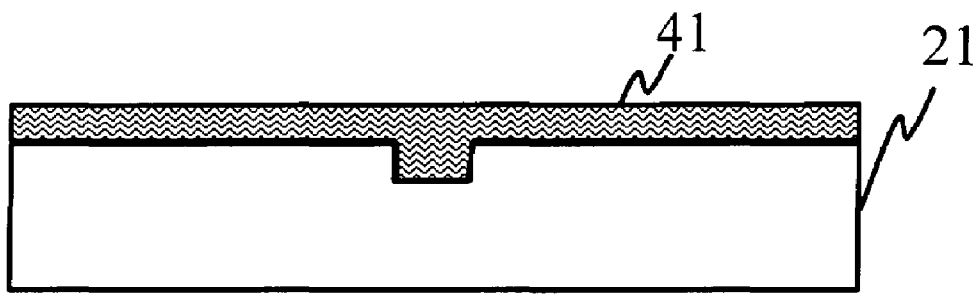
Figure 4E:
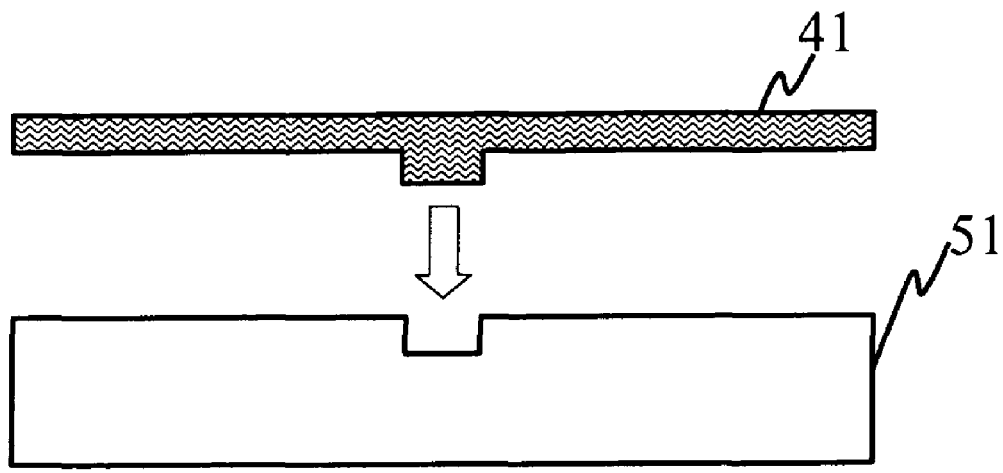
Figure 4F:
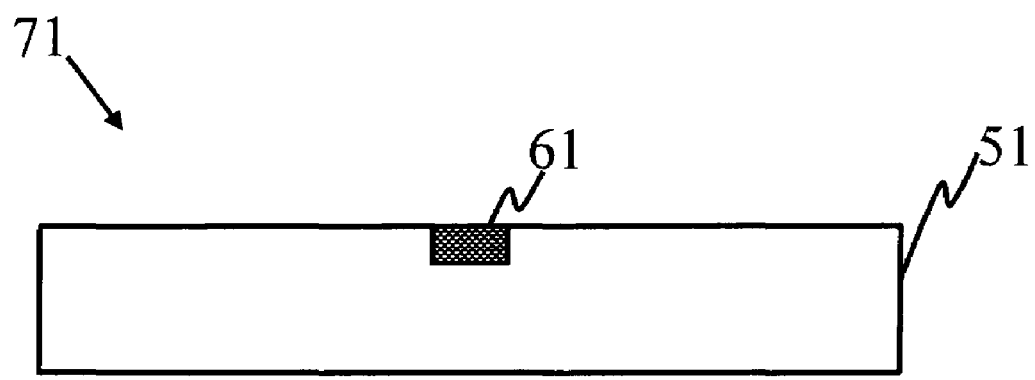

Please refer to FIGS. 4D to 4F. Therein the same processes as in the first embodiment are used. Electroforming technology is used to form a mold 41 having a micro-structure pattern thereon according step 100 in FIG. 1. The micro-structure pattern on the mold 41 is preferred to create a prominence. Then, the mold 41 is imprinted on a glass structure 51. The micro-structure pattern is thus copied onto the glass substrate 50 according to step 200 in FIG. 1. Finally, the clothing material 61 is coating on the glass substrate 51. The clothing material 60 is filled into the recesses of the micro-structure pattern of the glass substrate 51. The micro-structure element 71 is made according to step 300 in FIG. 1.

The micro-structure pattern as disclosed in the first and the second embodiments is an optical wave guide structure pattern. The polymer material is also used as a clothing material. The micro-structure pattern such as an optical wave guide structure is formed on the substrate by using a photo-lithography process. The micro-structure pattern is transformed onto a mold, which can be metal, by using an electroform method. After performing the molding glass process, the micro-structure element such as an optical wave guide element is formed.

The micro-structure pattern of the invention can approach nano-scale, so it is can be applied to manufacturing nano-scale elements.

Moreover, please refer to FIGS. 5A to 5H, which are schematic views showing steps of the method of manufacturing a micro-structure element by utilizing molding glass as disclosed in the third embodiment of the invention.

Figure 5A:
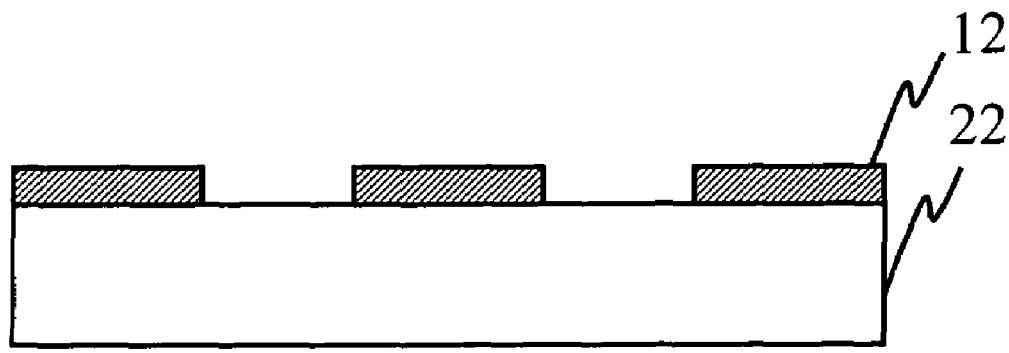
FIGS. 5A to 5E are schematic views, which show steps of the method of manufacturing a micro-structure element by utilizing molding glass as disclosed in the third embodiment of the invention.

Please refer to FIG. 5A. By using a photo-lithography process, such as photo lithography or electron beam lithography, photo-resist material is formed on the substrate 22 and then transformed to a photo-resist layer 12 after exposure and developing processes by a mask or e-beam direct writer (not shown). The photo-resist layer 21 has a micro-structure pattern thereon.

Figure 5B:
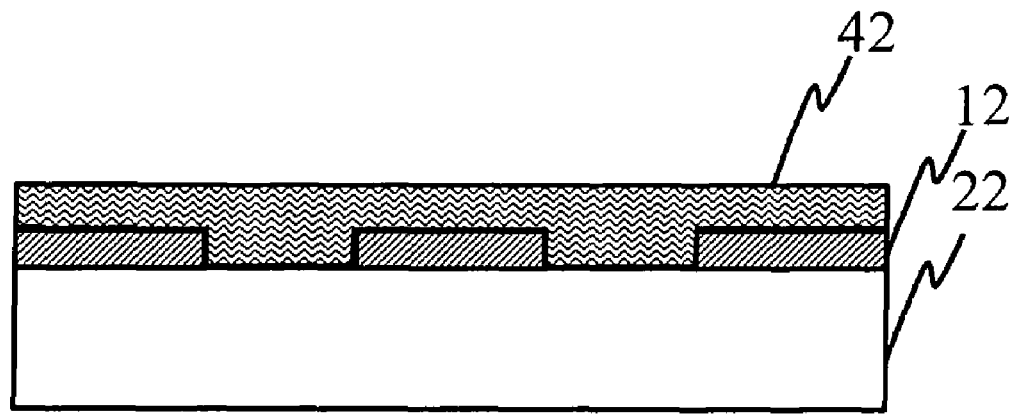

Refer to FIG. 5B. By using electroforming technology, a mold 42 having a nano-scale micro-structure pattern is formed according to step 100 in FIG. 1. In this embodiment, a film can be formed on the mold 42 by using an electroplating process, evaporating process, or sputtering process. The material of the film is noble metal material or nitride. This improves the life-time of the mold 42.

Figure 5C:
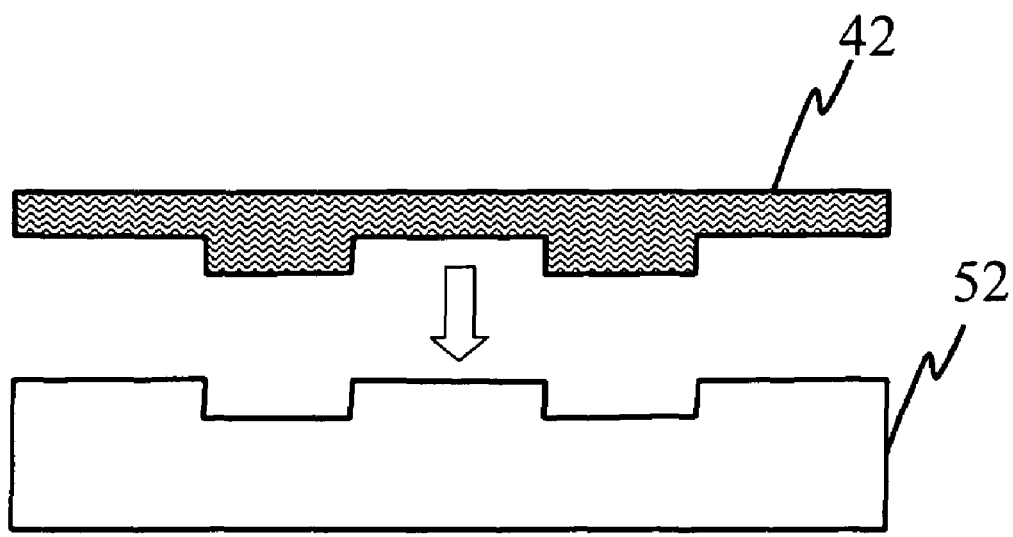

Please refer to FIG. 5C. By using a glass molding machine (not shown), the mold 42 is imprinted on a glass structure 52. Therefore, the micro-structure pattern is copied onto the glass substrate 52. The glass substrate 52 having a micro-structure pattern is thus formed according to step 200 in FIG. 1.

Figure 5D:
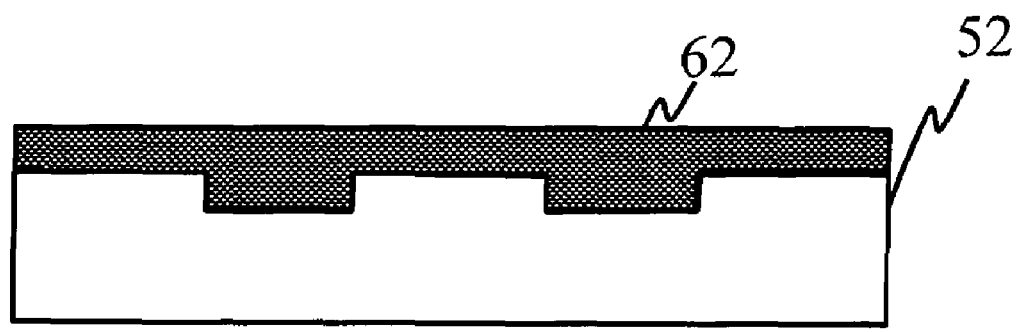

Refer to FIG. 5D. The clothing material 62, which is applied to a nano-scale element, is coated on the surface of the glass substrate 52. The above-mentioned coating method is performed so as to from polymer material on the glass substrate 52, or to form the metal material on the glass substrate 52 by using a sputtering machine (not shown). The clothing material 62 is composed of semi-conductor material or ceramic material.

Figure 5E:
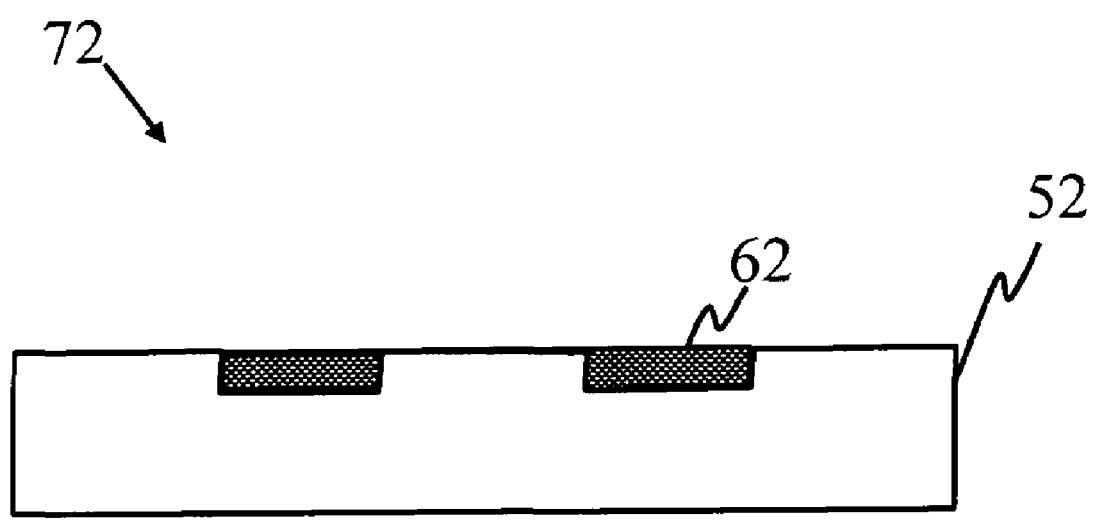

Finally, please refer to FIG. 5E. The clothing material 62 is ground to remove redundant parts by using a chemical etching process, plasma etching process, or precise polish process. The micro-structure element is thus formed, and is applied to manufacture nano-scale elements.

To sum up the above description, the invention provides a method of manufacturing micro-structure elements by utilizing molding glass. Although the processes comprise a photo-lithography process and electroform method to form a mold for imprinting, the rear processes comprise glass molding technology that not only maintains the precision of the manufacturing process, but also allows the benefit of mass production. Moreover, it can also be applied to manufacturing optical communication elements, optical wave guide integrated elements, and even nano-scale elements.

Furthermore, the invention has the advantage of imprinting technology, which allows for excellent precision. There are very few errors in duplicating the micro-structure elements. Thus, the invention is more helpful for mass production than the prior technology, which only utilizes photo-lithography.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing an optical wave guide structure element by utilizing a molding glass, the steps of the method comprising:

forming a metal mold having an optical wave guide structure pattern in a prominence thereon from an electroforming material by using an electroforming process;

imprinting the metal mold directly onto a glass substrate for making a copy of the optical wave guide structure pattern of the metal mold in a recess directly on the glass substrate so that the glass substrate is used as the molding glass; and filling a clothing material into the copy of the optical wave guide structure pattern of the glass substrate to obtain the optical wave guide structure element.

2. A method of manufacturing a micro-structure element by utilizing a molding glass, the steps of the method comprising:

forming a mold having a micro-structure pattern in prominence thereon from an electroforming material by using an electroforming process;

imprinting the mold directly onto a glass substrate for making a copy of the micro-structure pattern of the mold in recess directly on the glass substrate so that the glass substrate is used as the molding glass; and filling a clothing material into the copy of the micro-structure pattern of the glass substrate to obtain the micro-structure element.

3. The method of claim 2, wherein the mold is formed by the steps of performing a photo-lithography process for coating a photo-resist material on a substrate and forming a recess in the photo-resist material by using exposure and developing processes through a mask, and forming the electroforming material on the substrate to obtain the mold.

4. The method of claim 2, wherein the mold is formed by the steps of performing a photo-lithography process for forming a photo-resist material on a substrate and forming a recess in the photo-resist material by using exposure, developing, and etching processes, and forming the electroforming material on the substrate to obtain the mold.

5. The method of claim 2, wherein the electroforming material is metal.

6. The method of claim 2, wherein the step of making a copy of the micro-structure pattern of the mold on the glass substrate utilizes a glass molding machine.

7. The method of claim 2, further comprises a step of heating the mold and the glass structure before the step of imprinting the mold onto the glass substrate.

8. The method of claim 2, wherein the dimension of micro-structure pattern is nano-scale.

9. The method of claim 2, further comprises a step of forming a hard film on the mold for improving the life time of the mold.

10. The method of claim 9, wherein the step of forming a hard film on the mold for improving the life time of the mold is performed by using electroplating process, evaporating process, or sputtering process.

11. The method of claim 9, wherein the material of the hard film is selected from the group of noble metal material and nitride.

12. The method of claim 2, wherein the clothing material is selected from the group of polymer, metal, semi-conductor, and ceramic material.

13. The method of claim 2, further comprises a step of polish the clothing material on the glass substrate for removing a redundant part of the clothing material after the step of filling a clothing material into the copy of the micro-structure pattern of the glass substrate.

14. The method of claim 13, wherein the step of polish the clothing material on the glass substrate is performed by using a process selected from the group of chemical etching process, plasma etching process, precise polish process, and the combination.

15. The method of claim 2, wherein the step of imprinting the mold directly onto the glass substrate further comprises:

putting the mold, the glass substrate, and an upper die sequentially into a die ring;

raising temperature of a die set including the upper die and the die ring so that the mold and the glass substrate are heated at the same time;

approaching the temperature of the die set to a specific degree so that heat stress is brought on the upper die;

cooling the die set; and releasing the upper die from the die ring when the temperature of the die set is cooled down to atmospheric temperature to complete the glass substrate having the micro-structure pattern as the molding glass.

* * * * *